United States Patent
Singidi et al.

(10) Patent No.: US 11,688,473 B2
(45) Date of Patent: *Jun. 27, 2023

(54) SLC PAGE READ

(71) Applicant: Micron Technology, Inc., Boise, ID (US)

(72) Inventors: Harish Reddy Singidi, Fremont, CA (US); Scott Anthony Stoller, Boise, ID (US); Jung Sheng Hoei, Newark, CA (US); Ashutosh Malshe, Fremont, CA (US); Gianni Stephen Alsasua, Rancho Cordova, CA (US); Kishore Kumar Muchherla, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/986,827

(22) Filed: Aug. 6, 2020

(65) Prior Publication Data

US 2020/0365219 A1  Nov. 19, 2020

Related U.S. Application Data

(63) Continuation of application No. 15/799,655, filed on Oct. 31, 2017, now Pat. No. 10,755,793.

(51) Int. Cl.
*G11C 16/34* (2006.01)
*G11C 16/28* (2006.01)
(Continued)

(52) U.S. Cl.
CPC ...... *G11C 16/3459* (2013.01); *G11C 11/5642* (2013.01); *G11C 11/5671* (2013.01);
(Continued)

(58) Field of Classification Search
CPC . G11C 16/3459; G11C 16/0483; G11C 16/28; G11C 16/342
See application file for complete search history.

(56) References Cited

U.S. PATENT DOCUMENTS 9,741,444 B2   8/2017  Reusswig et al.
10,755,793 B2  8/2020  Singidi et al.
(Continued)

FOREIGN PATENT DOCUMENTS

CN   101339526   1/2009
CN   101432819   5/2009
(Continued)

OTHER PUBLICATIONS

"Chinese Application Serial No. 201811291888.3, Office Action dated Oct. 27, 2022", with English translation, 17 pages.
(Continued)

*Primary Examiner* — Alfredo Bermudez Lozada
(74) *Attorney, Agent, or Firm* — Schwegman Lundberg & Woessner, P.A.

(57) ABSTRACT

NAND memory devices are described that utilize higher read-margin cell types to provide a more granular read disturb indicator without utilizing dummy cells. For example, a NAND architecture may have some cells that are configured as SLC or MLC cells. SLC or MLC cells have more read disturb margin—that is these cells can withstand more read disturb current leakage into the cell before a bit error occurs than TLC or QLC cells. These higher margin cells may serve as the read disturb indicator for a group of cells that have a comparatively lower read disturb margin. Since there are more pages of these higher margin cells than there are pages of dummy cells, these indicators may serve a smaller group of pages than the dummy pages. This
(Continued)

reduces the time needed to complete a read disturb scan as fewer pages need to be scanned.

20 Claims, 10 Drawing Sheets

(51) Int. Cl.
  *G11C 11/56* (2006.01)
  *G11C 16/26* (2006.01)
  *G11C 16/04* (2006.01)

(52) U.S. Cl.
  CPC .............. *G11C 16/26* (2013.01); *G11C 16/28* (2013.01); *G11C 16/3427* (2013.01); *G11C 16/3431* (2013.01); *G11C 16/0483* (2013.01)

(56) References Cited

U.S. PATENT DOCUMENTS

| | | | |
|---|---|---|---|
| 2013/0107625 | A1 | 5/2013 | Yang et al. |
| 2014/0006688 | A1 | 1/2014 | Yu et al. |
| 2016/0078960 | A1 | 3/2016 | Yang et al. |
| 2017/0076811 | A1* | 3/2017 | Reusswig .............. G11C 29/52 |
| 2018/0181300 | A1 | 6/2018 | Barndt et al. |
| 2019/0130983 | A1 | 5/2019 | Singidi et al. |

FOREIGN PATENT DOCUMENTS

| | | |
|---|---|---|
| CN | 102426859 | 4/2012 |
| CN | 103827971 | 5/2014 |
| CN | 103985415 | 8/2014 |
| CN | 105874541 | 8/2016 |
| CN | 109727622 A | 5/2019 |
| WO | 2008118705 | 10/2008 |

OTHER PUBLICATIONS

Zhang, Xuan, "MLC Flash Bit Flip Decoding Algorithm Based on Multiple Precision Sensing", Computer Measurement and Control, Issue 09, with Concise Statement of Relevance and English abstract, (Sep. 25, 2017), 7 pages.
U.S. Appl. No. 15/799,655 U.S. Pat. No. 10,755,793, filed Oct. 31, 2071, SLC Page Read.

* cited by examiner

SLC PAGE READ

PRIORITY APPLICATION

This application is a continuation of U.S. application Ser. No. 15/799,655, filed Oct. 31, 2017, which is incorporated herein by reference in its entirety.

BACKGROUND

Memory devices are typically provided as internal, semiconductor, integrated circuits in computers or other electronic devices. There are many different types of memory, including volatile and non-volatile memory.

Volatile memory requires power to maintain its data, and includes random-access memory (RAM), dynamic random-access memory (DRAM), or synchronous dynamic random-access memory (SDRAM), among others.

Non-volatile memory can retain stored data when not powered, and includes flash memory, read-only memory (ROM), electrically erasable programmable ROM (EEPROM), static RAM (SRAM), erasable programmable ROM (EPROM), resistance variable memory, such as phase-change random-access memory (PCRAM), resistive random-access memory (RRAM), magnetoresistive random-access memory (MRAM), or 3D XPoint™ memory, among others.

Flash memory is utilized as non-volatile memory for a wide range of electronic applications. Flash memory devices typically include one or more groups of one-transistor, floating gate or charge trap memory cells that allow for high memory densities, high reliability, and low power consumption.

Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a bit line.

Both NOR and NAND architecture semiconductor memory arrays are accessed through decoders that activate specific memory cells by selecting the word line coupled to their gates. In a NOR architecture semiconductor memory array, once activated, the selected memory cells place their data values on bit lines, causing different currents to flow depending on the state at which a particular cell is programmed. In a NAND architecture semiconductor memory array, a high bias voltage is applied to a drain-side select gate (SGD) line. Word lines coupled to the gates of the unselected memory cells of each group are driven at a specified passthrough voltage (e.g., Vpass) to operate the unselected memory cells of each group as pass transistors (e.g., to pass current in a manner that is unrestricted by their stored data values). Current then flows from the source line to the bit line through each series coupled group, restricted only by the selected memory cells of each group, placing current encoded data values of selected memory cells on the bit lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data.

However, flash memory cells can also represent one of more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context, to can refer to any memory cell that can store more than one bit of data per cell (i.e., that can represent more than two programmed states).

Traditional memory arrays are two-dimensional (2D) structures arranged on a surface of a semiconductor substrate. To increase memory capacity for a given area, and to decrease cost, the size of the individual memory cells has decreased. However, there is a technological limit to the reduction in size of the individual memory cells, and thus, to the memory density of 2D memory arrays. In response, three-dimensional (3D) memory structures, such as 3D NAND architecture semiconductor memory devices, are being developed to further increase memory density and lower memory cost.

Such 3D NAND devices often include strings of storage cells, coupled in series (e.g., drain to source), between one or more source-side select gates (SGSs) proximate a source, and one or more drain-side select gates (SGDs) proximate a bit line. In an example, the SGSs or the SGDs can include one or more field-effect transistors (FETs) or metal-oxide semiconductor (MOS) structure devices, etc. In some examples, the strings will extend vertically, through multiple vertically spaced tiers containing respective word lines. A semiconductor structure (e.g., a polysilicon structure) may extend adjacent a string of storage cells to form a channel for the storages cells of the string. In the example of a vertical string, the polysilicon structure may be in the form of a vertically extending pillar. In some examples the string may be "folded," and thus arranged relative to a U-shaped pillar. In other examples, multiple vertical structures may be stacked upon one another to form stacked arrays of storage cell strings.

Memory arrays or devices can be combined together to form a storage volume of a memory system, such as a solid-state drive (SSD), a Universal Flash Storage (UFS™) device, a MultiMediaCard (MMC) solid-state storage device, an embedded MMC device (eMMC™), etc. An SSD can be used as, among other things, the main storage device of a computer, having advantages over traditional hard drives with moving parts with respect to, for example, performance, size, weight, ruggedness, operating temperature range, and power consumption. For example, SSDs can have reduced seek time, latency, or other delay associated with magnetic disk drives (e.g., electromechanical, etc.). SSDs use non-volatile memory cells, such as flash memory cells to obviate internal battery supply requirements, thus allowing the drive to be more versatile and compact.

An SSD can include a number of memory devices, including a number of dies or logical units (e.g., logical unit numbers or LUNs), and can include one or more processors or other controllers performing logic functions required to operate the memory devices or interface with external systems. Such SSDs may include one or more flash memory die, including a number of memory arrays and peripheral circuitry thereon. The flash memory arrays can include a number of blocks of memory cells organized into a number of physical pages. In many examples, the SSDs will also include DRAM or SRAM (or other forms of memory die or other memory structures). The SSD can receive commands from a host in association with memory operations, such as read or write operations to transfer data (e.g., user data and associated integrity data, such as error data and address data, etc.) between the memory devices and the host, or erase operations to erase data from the memory devices.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and internet-connected appliances or devices (e.g., internet-of-things (IoT) devices, etc.), have varying storage needs depending on, among other things, the type of electronic device, use environment, performance expectations, etc.

Electronic devices can be broken down into several main components: a processor (e.g., a central processing unit (CPU) or other main processor); memory (e.g., one or more volatile or non-volatile random-access memory (RAM) memory device, such as dynamic RAM (DRAM), mobile or low-power double-data-rate synchronous DRAM (DDR SDRAM), etc.); and a storage device (e.g., non-volatile memory (NVM) device, such as flash memory, read-only memory (ROM), an SSD, an MMC, or other memory card structure or assembly, etc.). In certain examples, electronic devices can include a user interface (e.g., a display, touchscreen, keyboard, one or more buttons, etc.), a graphics processing unit (GPU), a power management circuit, a baseband processor or one or more transceiver circuits, etc.

Figure 1:
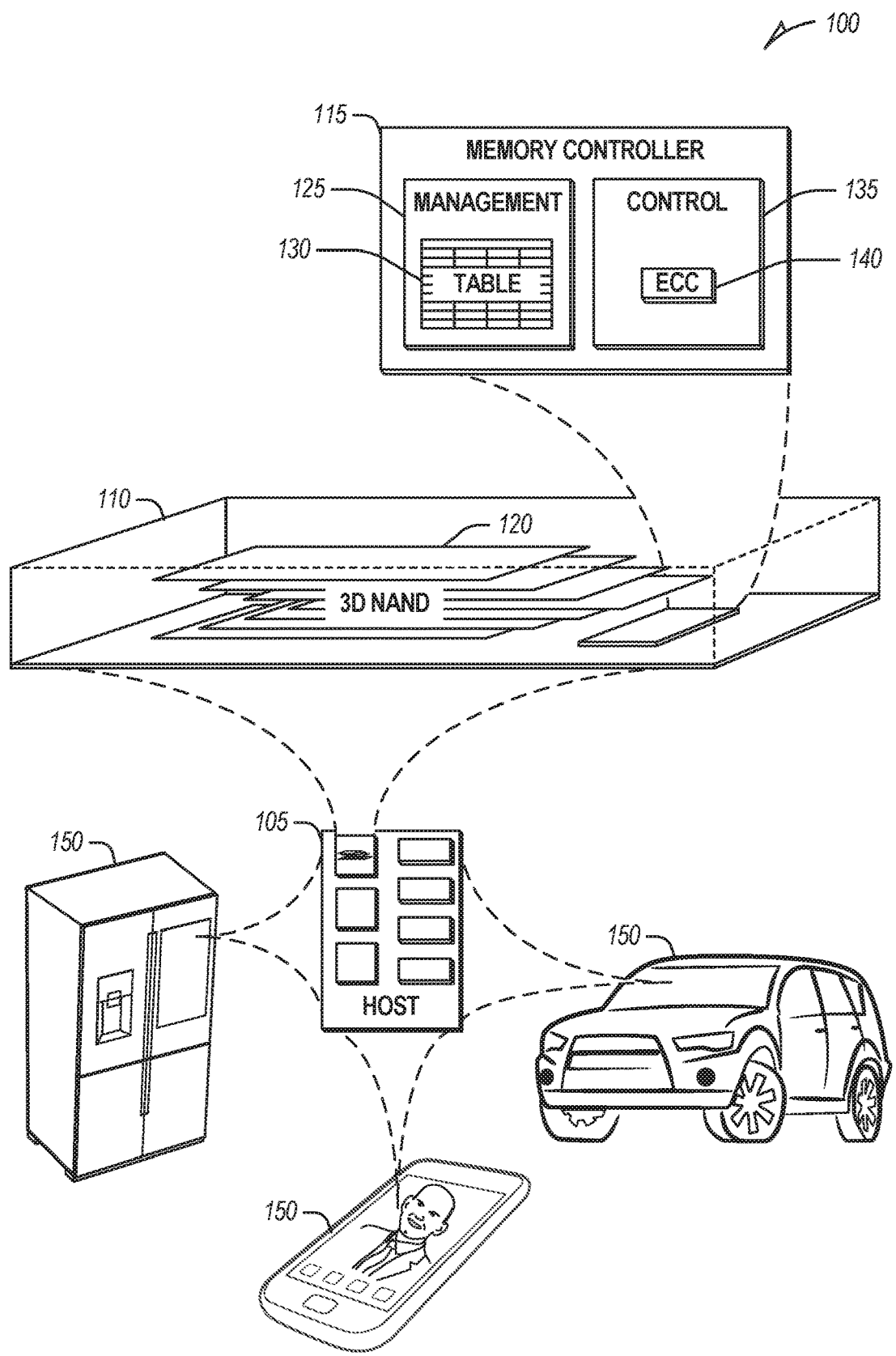
FIG. 1 illustrates an example of an environment including a memory device.

FIG. 1 illustrates an example of an environment 100 including a host device 105 and a memory device 110 configured to communicate over a communication interface. The host device 105 or the memory device 110 may be included in a variety of products 150, such as Internet of Things (IoT) devices (e.g., a refrigerator or other appliance, sensor, motor or actuator, mobile communication device, automobile, drone, etc.) to support processing, communications, or control of the product 150.

The memory device 110 includes a memory controller 115 and a memory array 120 including, for example, a number of individual memory die (e.g., a stack of three-dimensional (3D) NAND die). In 3D architecture semiconductor memory technology, vertical structures are stacked, increasing the number of tiers, physical pages, and accordingly, the density of a memory device (e.g., a storage device). In an example, the memory device 110 can be a discrete memory or storage device component of the host device 105. In other examples, the memory device 110 can be a portion of an integrated circuit (e.g., system on a chip (SOC), etc.), stacked or otherwise included with one or more other components of the host device 105.

One or more communication interfaces can be used to transfer data between the memory device 110 and one or more other components of the host device 105, such as a Serial Advanced Technology Attachment (SATA) interface, a Peripheral Component Interconnect Express (PCIe) interface, a Universal Serial Bus (USB) interface, a Universal Flash Storage (UFS) interface, an eMMC™ interface, or one or more other connectors or interfaces. The host device 105 can include a host system, an electronic device, a processor, a memory card reader, or one or more other electronic devices external to the memory device 110. In some examples, the host 105 may be a machine having some portion, or all, of the components discussed in reference to the machine 1000 of FIG. 10.

The memory controller 115 can receive instructions from the host 105, and can communicate with the memory array, such as to transfer data to (e.g., write or erase) or from (e.g., read) one or more of the memory cells, planes, sub-blocks, blocks, or pages of the memory array. The memory controller 115 can include, among other things, circuitry or firmware, including one or more components or integrated circuits. For example, the memory controller 115 can include one or more memory control units, circuits, or components configured to control access across the memory array 120 and to provide a translation layer between the host 105 and the memory device 110. The memory controller 115 can include one or more input/output (I/O) circuits, lines, or interfaces to transfer data to or from the memory array 120. The memory controller 115 can include a memory manager 125 and an array controller 135.

The memory manager 125 can include, among other things, circuitry or firmware, such as a number of components or integrated circuits associated with various memory management functions. For purposes of the present description example memory operation and management functions will be described in the context of NAND memory. Persons skilled in the art will recognize that other forms of non-volatile memory may have analogous memory operations or management functions. Such NAND management functions include wear leveling (e.g., garbage collection or reclamation), error detection or correction, block retirement, or one or more other memory management functions. The memory manager 125 can parse or format host commands (e.g., commands received from a host) into device commands (e.g., commands associated with operation of a memory array, etc.), or generate device commands (e.g., to accomplish various memory management functions) for the array controller 135 or one or more other components of the memory device 110.

The memory manager 125 can include a set of management tables 130 configured to maintain various information associated with one or more component of the memory device 110 (e.g., various information associated with a memory array or one or more memory cells coupled to the memory controller 115). For example, the management tables 130 can include information regarding block age, block erase count, error history, or one or more error counts (e.g., a write operation error count, a read bit error count, a read operation error count, an erase error count, etc.) for one or more blocks of memory cells coupled to the memory controller 115. In certain examples, if the number of detected errors for one or more of the error counts is above a threshold, the bit error can be referred to as an uncorrectable bit error. The management tables 130 can maintain a count of correctable or uncorrectable bit errors, among other things.

The array controller 135 can include, among other things, circuitry or components configured to control memory operations associated with writing data to, reading data from, or erasing one or more memory cells of the memory device 110 coupled to the memory controller 115. The memory operations can be based on, for example, host commands received from the host 105, or internally generated by the memory manager 125 (e.g., in association with wear leveling, error detection or correction, etc.).

The array controller 135 can include an error correction code (ECC) component 140, which can include, among other things, an ECC engine or other circuitry configured to detect or correct errors associated with writing data to or reading data from one or more memory cells of the memory device 110 coupled to the memory controller 115. The memory controller 115 can be configured to actively detect and recover from error occurrences (e.g., bit errors, operation errors, etc.) associated with various operations or storage of data, while maintaining integrity of the data transferred between the host 105 and the memory device 110, or maintaining integrity of stored data (e.g., using redundant RAID storage, etc.), and can remove (e.g., retire) failing memory resources (e.g., memory cells, memory arrays, pages, blocks, etc.) to prevent future errors.

The memory array 120 can include several memory cells arranged in, for example, a number of devices, planes, sub-blocks, blocks, or pages. As one example, a 48 GB TLC NAND memory device can include 18,592 bytes (B) of data per page (16,384+2208 bytes), 1536 pages per block, 548 blocks per plane, and 4 or more planes per device. As another example, a 32 GB MLC memory device (storing two bits of data per cell (i.e., 4 programmable states)) can include 18,592 bytes (B) of data per page (16,384+2208 bytes), 1024 pages per block, 548 blocks per plane, and 4 planes per device, but with half the required write time and twice the program/erase (P/E) cycles as a corresponding TLC memory device. Other examples can include other numbers or arrangements. In some examples, a memory device, or a portion thereof, may be selectively operated in SLC mode, or in a desired MLC mode (such as TLC, QLC, etc.).

In operation, data is typically written to or read from the NAND memory device 110 in pages, and erased in blocks. However, one or more memory operations (e.g., read, write, erase, etc.) can be performed on larger or smaller groups of memory cells, as desired. The data transfer size of a NAND memory device 110 is typically referred to as a page, whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB may include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells or memory arrays 120 can provide for different page sizes, or may require different amounts of metadata associated therewith. For example, different memory device types may have different bit error rates, which can lead to different amounts of metadata necessary to ensure integrity of the page of data (e.g., a memory device with a higher bit error rate may require more bytes of error correction code data than a memory device with a lower bit error rate). As an example, a multi-level cell (MLC) NAND flash device may have a higher bit error rate than a corresponding single-level cell (SLC) NAND flash device. As such, the MLC device may require more metadata bytes for error data than the corresponding SLC device.

Figure 2:
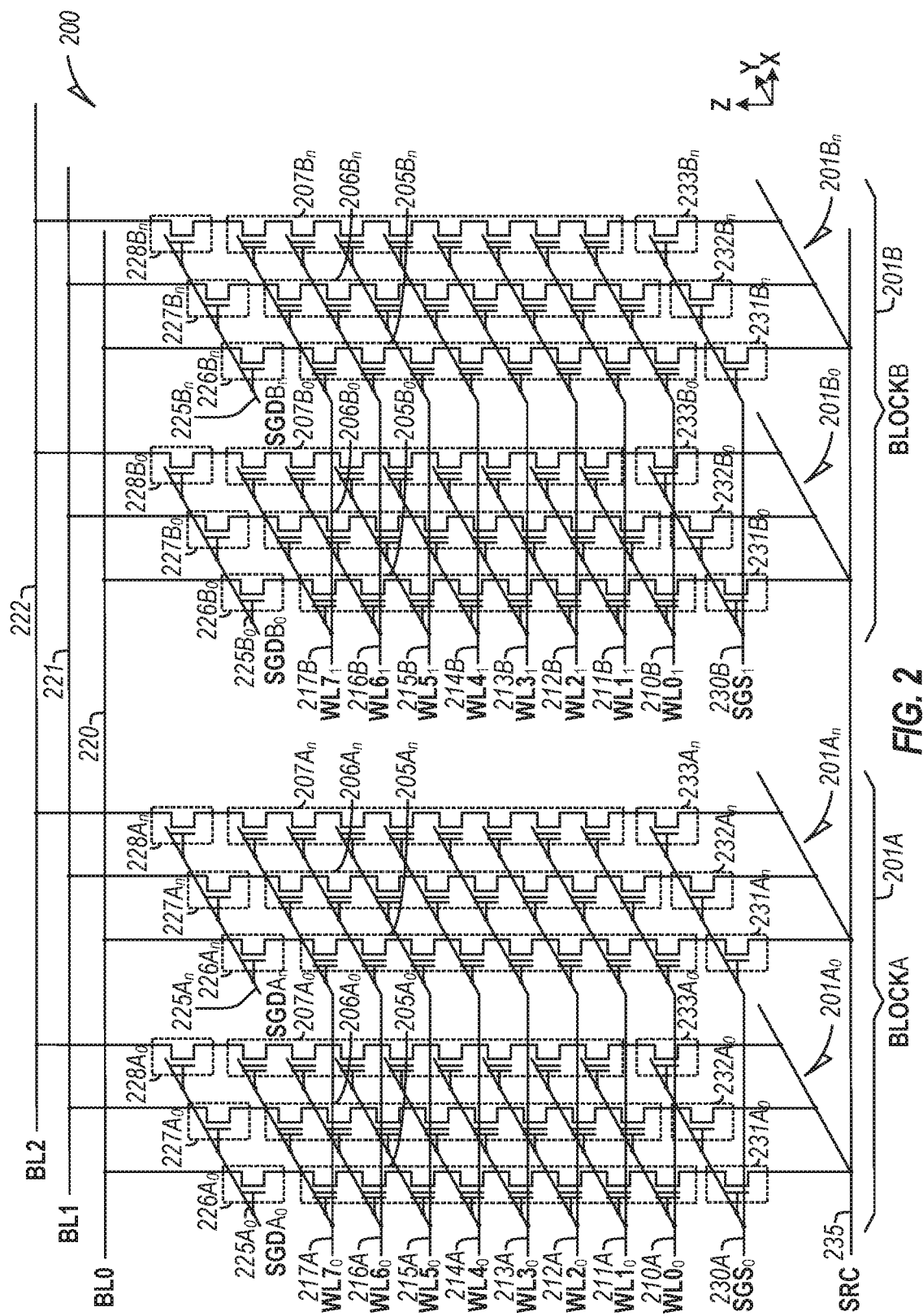
FIGS. 2-3 illustrate schematic diagrams of an example of a 3D NAND architecture semiconductor memory array.

FIG. 2 illustrates an example schematic diagram of a 3D NAND architecture semiconductor memory array 200 including a number of strings of memory cells (e.g., first-third $A_0$ memory strings $205A_0$-$207A_0$, first-third $A_n$ memory strings $205A_n$-$207A_n$, first-third $B_0$ memory strings $205B_0$-$207B_0$, first-third $B_n$ memory strings $205B_n$-$207B_n$, etc.), organized in blocks (e.g., block A 201A, block B 201B, etc.) and sub-blocks (e.g., sub-block $A_0$ $201A_0$, sub-block $A_n$ $201A_n$, sub-block $B_0$ $201B_0$, sub-block $B_n$ $201B_n$, etc.). The memory array 200 represents a portion of a greater number of similar structures that would typically be found in a block, device, or other unit of a memory device.

Each string of memory cells includes a number of tiers of charge storage transistors (e.g., floating gate transistors, charge-trapping structures, etc.) stacked in the Z direction, source to drain, between a source line (SRC) 235 or a source-side select gate (SGS) (e.g., first-third $A_0$ SGS $231A_0$-$233A_0$, first-third $A_n$ SGS $231A_n$-$233A_n$, first-third $B_0$ SGS $231B_0$-$233B_0$, first-third $B_n$ SGS $231B_n$-$233B_n$, etc.) and a drain-side select gate (SGD) (e.g., first-third $A_0$ SGD $226A_0$-$228A_0$, first-third $A_n$ SGD $226A_n$-$228A_n$, first-third $B_0$ SGD $226B_0$-$228B_0$, first-third B SGD $226B_n$-$228B_n$, etc.). Each string of memory cells in the 3D memory array can be arranged along the X direction as data lines (e.g., bit lines (BL) BL0-BL2 220-222), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 256, 384, etc.). Although illustrated herein as having two blocks, each block having two sub-blocks, each sub-block having a single physical page, each physical page having three strings of memory cells, and each string having 8 tiers of memory cells, in other examples, the memory array 200 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16,384+2208 bytes), 1536 pages per block, 548 blocks per plane, and 4 or more planes per device.

Each memory cell in the memory array 200 includes a control gate (CG) coupled to (e.g., electrically or otherwise operatively connected to) an access line (e.g., word lines (WL) $WL0_0$-$WL7_0$ 210A-217A, $WL0_1$-$WL7_1$ 210B-217B, etc.), which collectively couples the control gates (CGs) across a specific tier, or a portion of a tier, as desired. Specific tiers in the 3D memory array, and accordingly, specific memory cells in a string, can be accessed or controlled using respective access lines. Groups of select gates can be accessed using various select lines. For example, first-third $A_0$ SGD $226A_0$-$228A_0$ can be accessed using an $A_0$ SGD line $SGDA_0$ $225A_0$, first-third $A_n$ SGD $226A_n$-$228A_n$ can be accessed using an $A_n$ SGD line $SGDA_n$ $225A_n$, first-third $B_0$ SGD $226B_0$-$228B_0$ can be accessed using an $B_0$ SGD line $SGDB_0$ $225B_0$, and first-third $B_n$ SGD $226B_n$-$228B_n$ can be accessed using an $B_0$ SGD line $SGDB_n$ $225B_n$. First-third $A_0$ SGS $231A_0$-$233A_0$ and first-third $A_n$ SGS $231A_n$-$233A_n$ can be accessed using a gate select line $SGS_0$ 230A, and first-third $B_0$ SGS $231B_0$-$233B_0$ and first-third $B_n$ SGS $231B_n$-$233B_n$ can be accessed using a gate select line $SGS_1$ 230B.

In an example, the memory array 200 can include a number of levels of semiconductor material (e.g., polysilicon, etc.) configured to couple the control gates (CGs) of each memory cell or select gate (or a portion of the CGs or select gates) of a respective tier of the array. Specific strings of memory cells in the array can be accessed, selected, or controlled using a combination of bit lines (BLs) and select gates, etc., and specific memory cells at one or more tiers in the specific strings can be accessed, selected, or controlled using one or more access lines (e.g., word lines).

Figure 3:
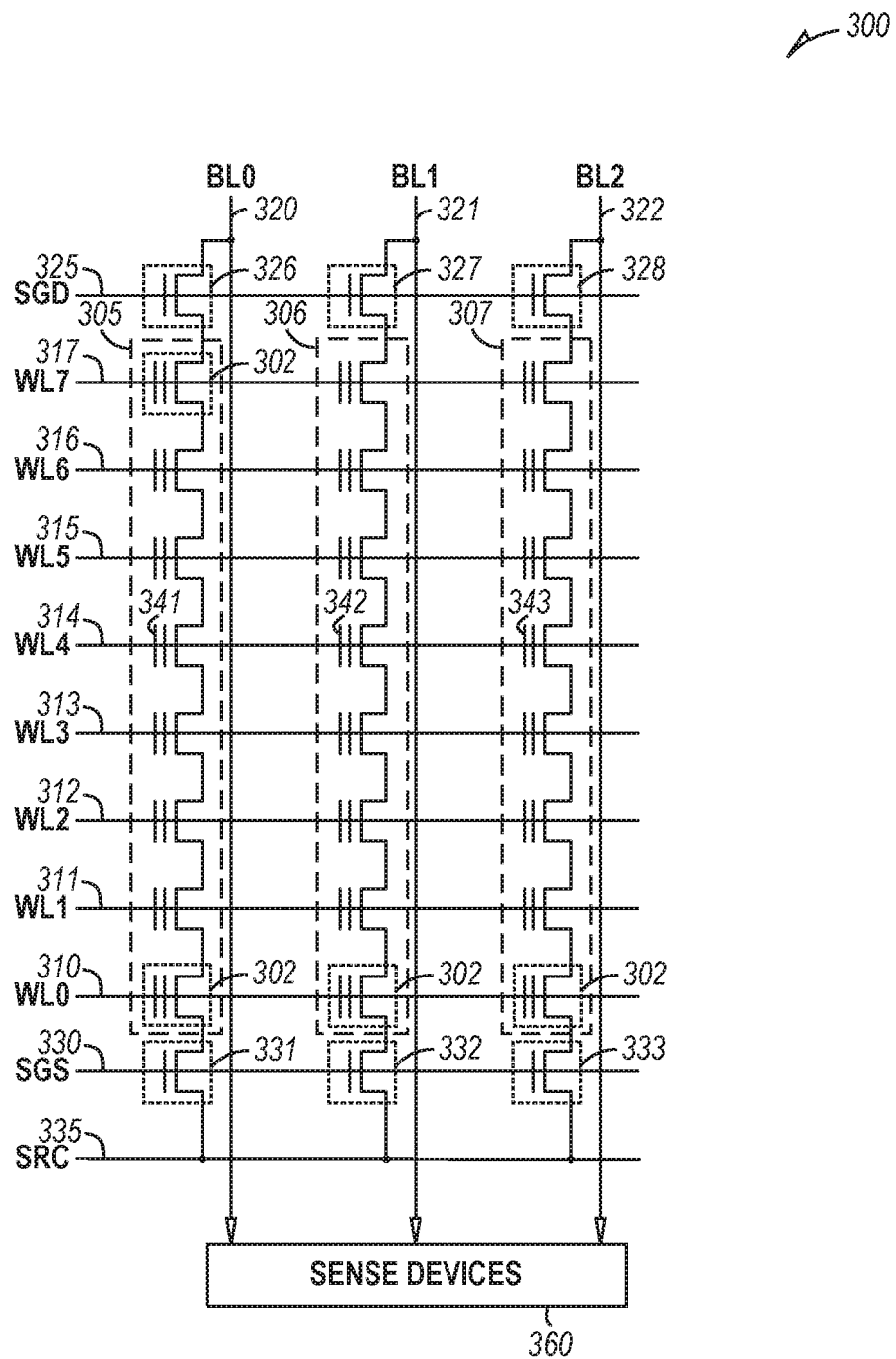

FIG. 3 illustrates an example schematic diagram of a portion of a NAND architecture semiconductor memory array 300 including a plurality of memory cells 302 arranged in a two-dimensional array of strings (e.g., first-third strings 305-307) and tiers (e.g., illustrated as respective word lines (WL) WL0-WL7 310-317, a drain-side select gate (SGD) line 325, a source-side select gate (SGS) line 330, etc.), and sense amplifiers or devices 360. For example, the memory array 300 can illustrate an example schematic diagram of a portion of one physical page of memory cells of a 3D NAND architecture semiconductor memory device, such as illustrated in FIG. 2.

Each string of memory cells is coupled to a source line (SRC) using a respective source-side select gate (SGS) (e.g., first-third SGS 331-333), and to a respective data line (e.g., first-third bit lines (BL) BL0-BL2 320-322) using a respective drain-side select gate (SGD) (e.g., first-third SGD 326-328). Although illustrated with 8 tiers (e.g., using word lines (WL) WL0-WL7 310-317) and three data lines (BL0-BL2 326-328) in the example of FIG. 3, other examples can include strings of memory cells having more or fewer tiers or data lines, as desired.

In a NAND architecture semiconductor memory array, such as the example memory array 300, the state of a selected memory cell 302 can be accessed by sensing a current or voltage variation associated with a particular data line containing the selected memory cell. The memory array 300 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., WL4), and thus, to a control gate of each memory cell coupled to the selected word lines (e.g., first-third control gates (CGs) 341-343 of the memory cells coupled to WL4). Programming pulses can begin, for example, at or near 15V, and, in certain examples, can increase in magnitude during each programming pulse application. While the program voltage is applied to the selected word lines, a potential, such as a ground potential (e.g., Vss), can be applied to the data lines (e.g., bit lines) and substrates (and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a passthrough voltage (Vpass) can be applied to one or more word lines having memory cells that are not targeted for programming, or an inhibit voltage (e.g., Vcc) can be applied to data lines (e.g., bit lines) having memory cells that are not targeted for programming, for example, to inhibit charge from being transferred from the channels to the floating gates of such non-targeted memory cells. The passthrough voltage can be variable, depending, for example, on the proximity of the applied passthrough voltages to a word line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific word line, such as WL4, a passthrough voltage of 10V can be applied to one or more other word lines, such as WL3, WL5, etc., to inhibit programming of non-targeted memory cells, or to retain the values stored on such memory cells not targeted for programming. As the distance between an applied program voltage and the non-targeted memory cells increases, the passthrough voltage required to refrain from programming the non-targeted memory cells can decrease. For example, where a programming voltage of 15V is applied to WL4, a passthrough voltage of 10V can be applied to WL3 and WL5, a passthrough voltage of 8V can be applied to WL2 and WL6, a passthrough voltage of 7V can be applied to WL1 and WL7, etc. In other examples, the passthrough voltages, or number of word lines, etc., can be higher or lower, or more or less.

The sense amplifiers 360, coupled to one or more of the data lines (e.g., first, second, or third bit lines (BL0-BL2) 320-322), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically Vpgm) can be applied to the substrates (and thus the channels, between the sources and drains) of the memory cells targeted for erasure (e.g., using one or more bit lines, select gates, etc.), while the word lines of the targeted memory cells are kept at a potential, such as a ground potential (e.g., Vss), resulting in a charge transfer (e.g., direct injection or Fowler-Nordheim (FN) tunneling, etc.) from the floating gates of the targeted memory cells to the channels.

Figure 4:
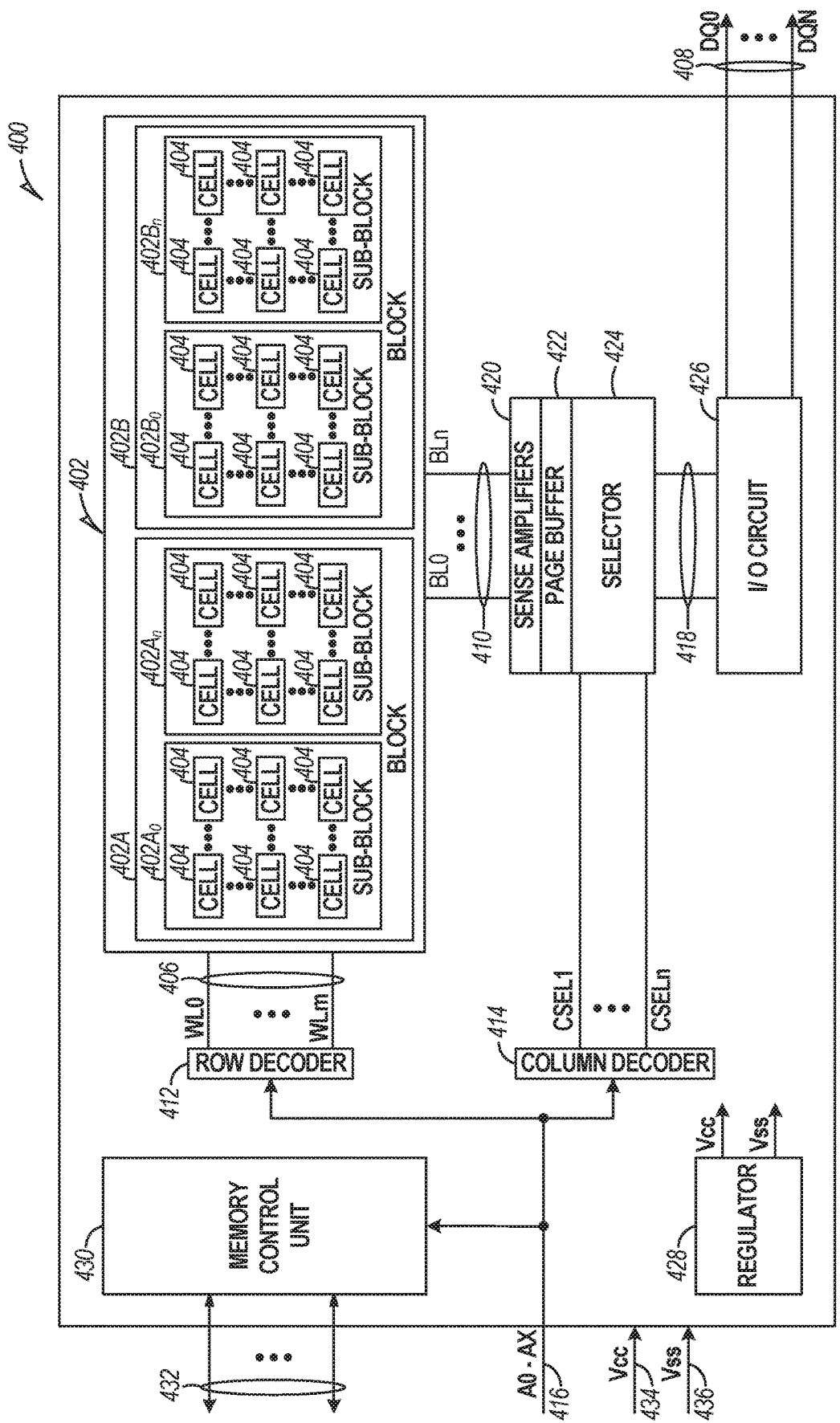
FIG. 4 illustrates an example block diagram of a memory module.

FIG. 4 illustrates an example block diagram of a memory device 400 including a memory array 402 having a plurality of memory cells 404, and one or more circuits or components to provide communication with, or perform one or more memory operations on, the memory array 402. The memory device 400 can include a row decoder 412, a column decoder 414, sense amplifiers 420, a page buffer 422, a selector 424, an input/output (I/O) circuit 426, and a memory control unit 430.

The memory cells 404 of the memory array 402 can be arranged in blocks, such as first and second blocks 402A, 402B. Each block can include sub-blocks. For example, the first block 402A can include first and second sub-blocks 402A$_0$, 402A$_n$, and the second block 402B can include first and second sub-blocks 402B$_0$, 402B$_n$. Each sub-block can include a number of physical pages, each page including a number of memory cells 404. Although illustrated herein as having two blocks, each block having two sub-blocks, and each sub-block having a number of memory cells 404, in other examples, the memory array 402 can include more or fewer blocks, sub-blocks, memory cells, etc. In other examples, the memory cells 404 can be arranged in a number of rows, columns, pages, sub-blocks, blocks, etc., and accessed using, for example, access lines 406, first data lines 410, or one or more select gates, source lines, etc.

The memory control unit 430 can control memory operations of the memory device 400 according to one or more signals or instructions received on control lines 432, including, for example, one or more clock signals or control signals that indicate a desired operation (e.g., write, read, erase, etc.), or address signals (A0-AX) received on one or more address lines 416. One or more devices external to the memory device 400 can control the values of the control signals on the control lines 432, or the address signals on the address line 416. Examples of devices external to the memory device 400 can include, but are not limited to, a host, a memory controller, a processor, or one or more circuits or components not illustrated in FIG. 4.

The memory device 400 can use access lines 406 and first data lines 410 to transfer data to (e.g., write or erase) or from (e.g., read) one or more of the memory cells 404. The row decoder 412 and the column decoder 414 can receive and decode the address signals (A0-AX) from the address line 416, can determine which of the memory cells 404 are to be accessed, and can provide signals to one or more of the access lines 406 (e.g., one or more of a plurality of word lines (WL0-WLm)) or the first data lines 410 (e.g., one or more of a plurality of bit lines (BL0-BLn)), such as described above.

The memory device 400 can include sense circuitry, such as the sense amplifiers 420, configured to determine the values of data on (e.g., read), or to determine the values of data to be written to, the memory cells 404 using the first data lines 410. For example, in a selected string of memory cells 404, one or more of the sense amplifiers 420 can read a logic level in the selected memory cell 404 in response to a read current flowing in the memory array 402 through the selected string to the data lines 410.

One or more devices external to the memory device 400 can communicate with the memory device 400 using the I/O lines (DQ0-DQN) 408, address lines 416 (A0-AX), or control lines 432. The input/output (I/O) circuit 426 can transfer values of data in or out of the memory device 400, such as in or out of the page buffer 422 or the memory array 402, using the I/O lines 408, according to, for example, the control lines 432 and address lines 416. The page buffer 422 can store data received from the one or more devices external to the memory device 400 before the data is programmed into relevant portions of the memory array 402, or can store data read from the memory array 402 before the data is transmitted to the one or more devices external to the memory device 400.

The column decoder 414 can receive and decode address signals (A0-AX) into one or more column select signals (CSEL1-CSELn). The selector 424 (e.g., a select circuit) can receive the column select signals (CSEL1-CSELn) and select data in the page buffer 422 representing values of data to be read from or to be programmed into memory cells 404. Selected data can be transferred between the page buffer 422 and the I/O circuit 426 using second data lines 418.

The memory control unit 430 can receive positive and negative supply signals, such as a supply voltage (Vcc) 434 and a negative supply (Vss) 436 (e.g., a ground potential), from an external source or supply (e.g., an internal or external battery, an AC-to-DC converter, etc.). In certain examples, the memory control unit 430 can include a regulator 428 to internally provide positive or negative supply signals.

As previously described, to read the value of a NAND cell a read voltage is applied to that NAND cell and a passthrough voltage (Vpass) is applied to surrounding cells. This passthrough voltage may be a voltage that is higher than a read voltage, but lower than a voltage used to program a cell. This passthrough voltage may slightly increase the charge stored in the surrounding cells. If the cell is exposed to the passthrough voltage enough times (e.g., a nearby cell is read often), the value stored in the cell may be changed. This phenomenon is called read disturb.

In order to monitor for these read disturb effects, NAND memory devices may have a counter to count the number of times a particular cell has been read. When the counter exceeds a threshold, the NAND device performs a read disturb scan of the memory cells to determine if they are suffering from, or in danger of suffering from a read disturb error. A read disturb scan comprises operations to determine if the memory cell suffers from a present read disturb error or is likely to suffer from a read disturb error in the near future. A read disturb error is where the value of the cell has changed as a result of read disturb effects. For example, a present read disturb error may be detected if the cell exhibits bit errors that are detectable utilizing ECC methods. Likelihood of suffering from a read disturb error in the near future may be determined if the cell voltage level is such that application of more than a predetermined number of Vpass voltages to the cell is likely to change the value stored in the cell. In some examples, rather than do a read disturb scan once the counter exceeds the threshold, the NAND may assume the cell is at risk and simply copy the cell to a new cell and mark the old cell as invalid. The old cell may eventually be garbage collected, erased, and put back into service. In some examples, if the scan shows that a cell is suffering from, or in danger of suffering from a read disturb error, corrective action may be taken. For example, the cell's contents may be copied to a different cell.

One problem with the above approach is the granularity of the counter. NAND memory devices could not reasonably keep a counter for every cell in the NAND. This would take more memory to manage the NAND than the NAND is capable of storing. In some examples, the NAND may keep a counter on a superblock level. A superblock is a collection of physical flash blocks, where the SB consists of the same NAND block (by number) across all planes in the system. The problem is that this contains many blocks and many cells—some of which may not have been read disturbed enough to cause problems. Thus, scanning all memory cells in a superblock is a time intensive process.

One approach used in the art is to use dummy memory pages that exist in each block of the NAND as read disturb indicators for a corresponding NAND page. These dummy cells may be assigned a group of pages and anytime a read operation is performed on any of the pages in the group, a test voltage may be applied to the dummy page. The test voltage may be a Vpass voltage, or may be a different voltage.

Figure 5:
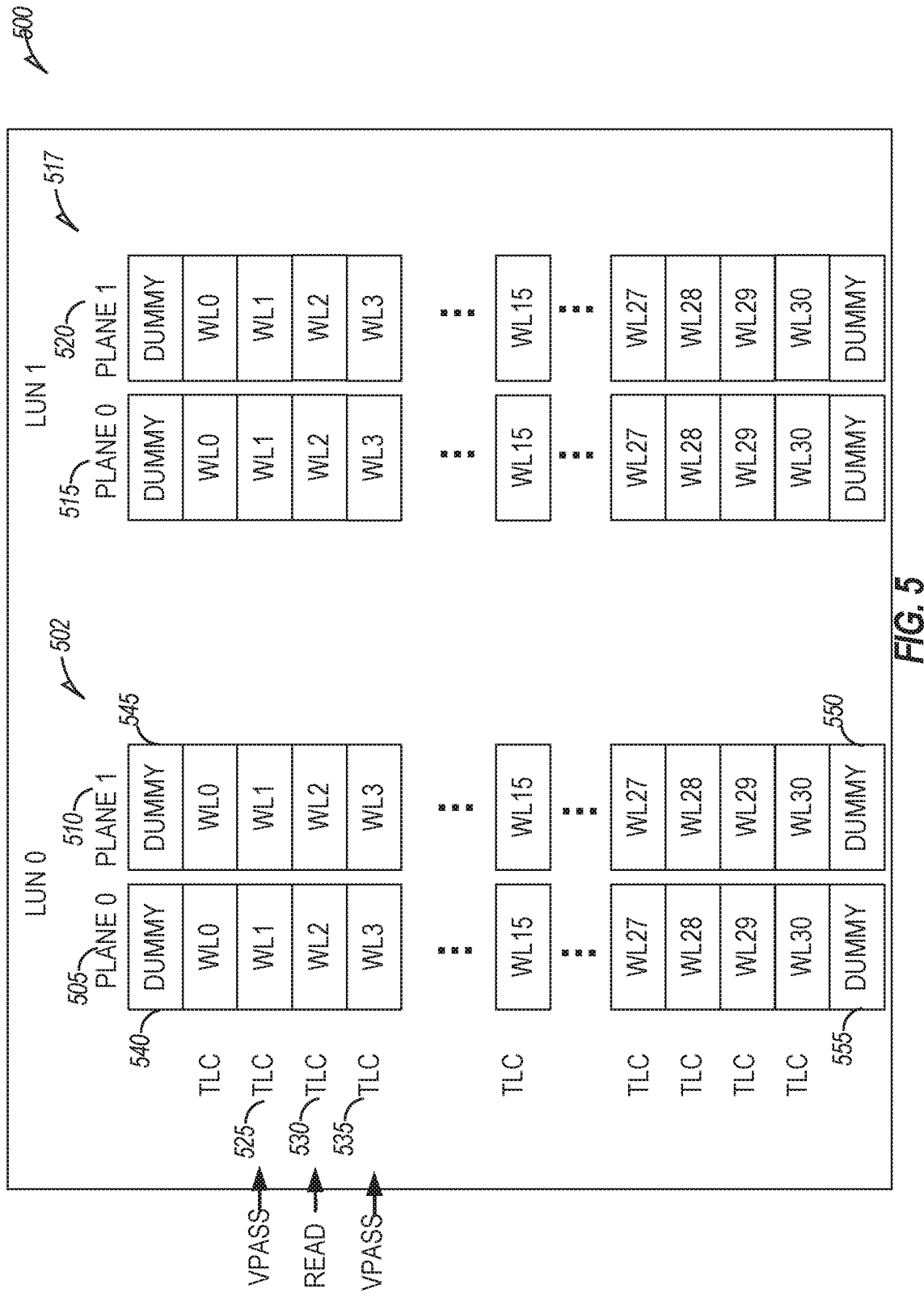
FIG. 5 illustrates a diagram of an example NAND superblock utilizing a dummy memory cell for read disturb detection according to some examples of the present disclosure.

FIG. 5 shows a diagram of an example NAND superblock 500 applying this approach. Two logical unit numbers (LUNs) 502, 517 are shown, each with two planes 505, 510, 515, and 520. Each plane has a group of TLC memory pages labeled WL0-WL30 and two dummy pages, such as for example at 540, 545, 555, 550. In the example of FIG. 5, pages WL0-WL14 may be assigned to a first group of pages with dummy page 540 as the read disturb indicator. Pages WL15-30 may be assigned to a second group of pages with dummy page 555 as the read disturb indicator. If a value is to be read out of page 530, then a Vpass voltage may be applied to nearby cells, such as at 525 and 535. Because the read occurred in a cell in the first group, a test voltage may be applied to dummy page 540 as dummy page 540 is the read disturb indicator for the first group. Likewise, a read occurring on WL15-WL 30 of plane 0 505 causes a test voltage to be applied to the dummy page 555.

To test whether the group of cells is at risk for bit errors from the effects of read disturb, the NAND may scan the corresponding read disturb indicators (the dummy pages). If the read disturb indicator fails the scan (e.g., a number of bit errors exceeds a threshold, a voltage on the dummy page is above a threshold for the value stored thereon, or the like), then the NAND memory device may read disturb scan all the pages in this group for read disturb errors. Pages that have read disturb errors or are deemed at risk for having an error in the near future may have their data copied to another page at a different physical location. The old pages may then be marked as invalid and finally garbage collected and reused.

The problem with this approach is that it is still very coarse—requiring read disturb scans of many NAND pages. Moreover, the use of dummy memory cells is problematic because dummy cells may have significant differences due to edge process effects, therefore requiring additional characterization work on the relation between read disturb stress on dummy cell and normal cells. In addition, dummy WLs may be more susceptible to defects because of edge process marginalities.

Disclosed in some examples, are systems, methods, machine-readable mediums, and NAND memory devices which utilize higher read-margin cell types to provide a more granular read disturb indicator without utilizing dummy cells. For example, a NAND architecture may have some cells that are configured as SLC or MLC cells. SLC or MLC cells have more read disturb margin—that is these cells can withstand more read disturb current leakage into the cell before a bit error occurs than TLC or QLC cells. These higher margin cells may serve as the read disturb indicator for a group of cells that have a comparatively lower read disturb margin. Since there are more pages of these higher margin cells than there are pages of dummy cells, these indicators may serve a smaller group of pages than the dummy pages. This reduces the time needed to complete a read disturb scan as fewer pages need to be scanned. Thus, depending on number of SLC and MLC WL's in a TLC block the number of pages scanned and refreshed when a read counter exceeds the threshold is reduced. Since a SLC page has more read disturb margin than a MLC page, in some examples, more TLC pages are allocated to the group for which SLC page is used as indicator than TLC pages allocated to an MLC page.

These higher margin cells may also store user data, but because of their higher margin there is little concern for losing user data. This is because the group that these higher margin cells serve as an indicator for contain TLC cells which have a lower margin and thus would suffer bit error earlier—thus a read disturb scan can catch any bit errors before they happen, or while they are still detectable.

Figure 6:
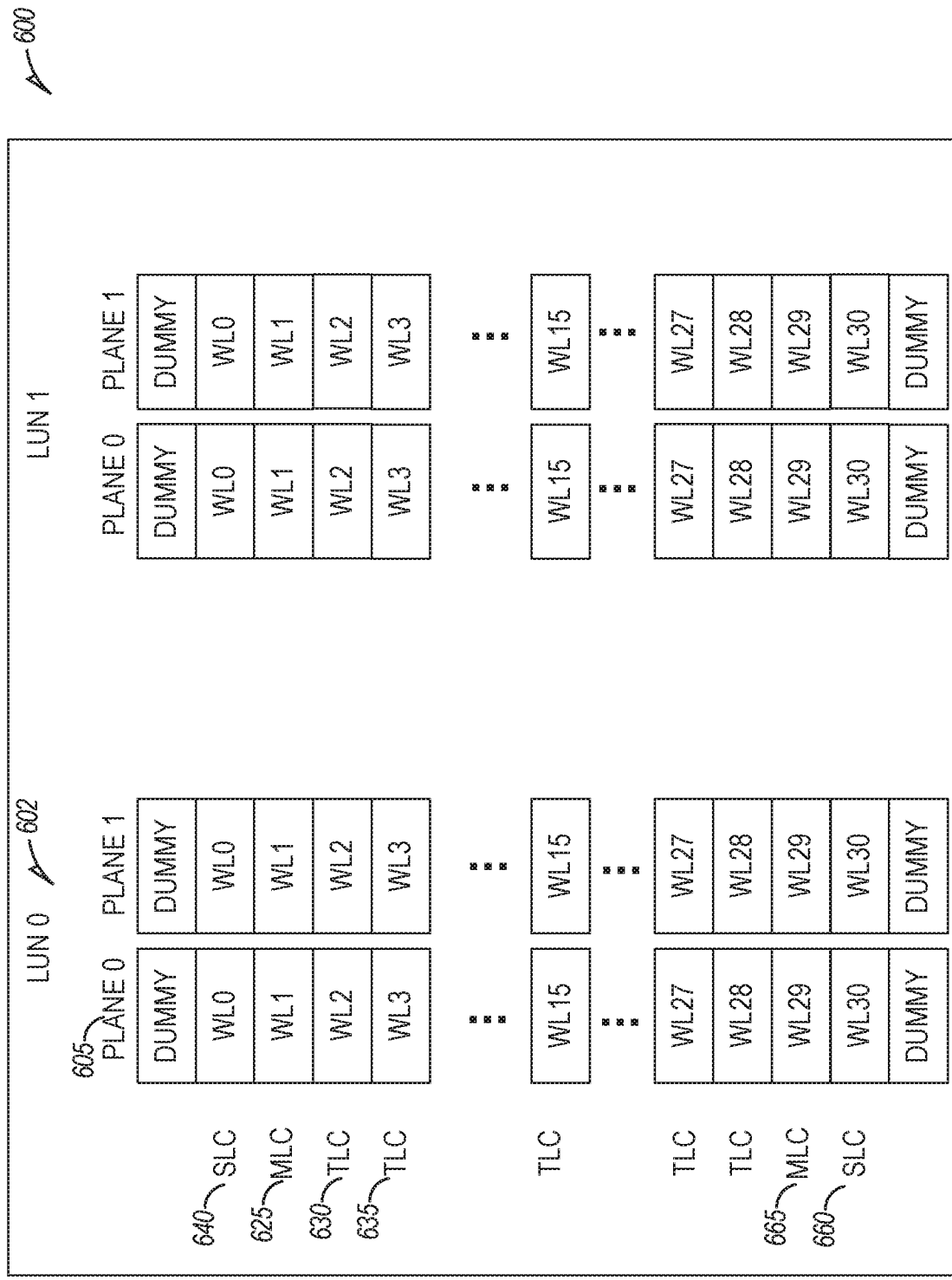
FIG. 6 illustrates a diagram of an example NAND superblock 600 utilizing SLC and MLC cells for read disturb detection according to some examples of the present disclosure.

FIG. 6 shows a diagram of an example NAND superblock 600 applying this approach. Plane 0 605 of LUN0 602 may have two SLC pages 640 and 660 and two MLC pages 625, and 665 and a number of TLC pages, such as pages WL2-28 (e.g., including TLC pages 630, 635). The SLC and MLC pages may be read disturb indicators for groups of TLC pages. Thus, a write to a TLC page may cause a corresponding test voltage to be applied to one of the SLC or MLC pages assigned as an indicator for that page (depending on the assigned grouping). In some examples, host data may be stored in these indicators (unlike when dummy cells are utilized). As there are more SLC and MLC pages than dummy pages, the groups of pages that are serviced by the indicator pages is smaller, and thus the read disturb scanning operation to determine which pages need to be fixed may take less time.

In some examples, the number of TLC pages assigned to a group that is serviced by an SLC indicator may be greater than the number of TLC pages assigned to a group that is serviced by an MLC indicator. This is due to the higher read-disturb margin of the SLC page over the MLC page.

In some examples, a read counter may still be utilized for the entire superblock (e.g., superblock 600) and once the counter exceeds the threshold, the NAND memory controller may first scan the SLC and MLC read disturb indicators to determine whether the corresponding TLC cells in the group serviced by that SLC or MLC page should be tested. For example, a bit error rate of the SLC and MLC pages may be utilized, a value of the pages may be compared, a voltage may be determined (and compared with a threshold) and the like. If the read disturb scan on the indicator page indicates a read disturb error is likely for the TLC cells in the group, then the system may scan the pages in the particular group.

As SLC and MLC has a higher read disturb margin, the trigger for determining that the group of TLC cells should be read disturbed scanned may be different than the trigger to determine whether the SLC or MLC cell itself would suffer a read disturb error or is likely to suffer from a read disturb error in the near future. For example, a voltage threshold may compare an expected normal voltage.

In the example of FIG. 6, SLC page 640 may serve as a read disturb indicator for WL2-WL8, MLC page 625 may serve as a read disturb indicator for WL8-WL14. Similarly, SLC 660 may serve as a read disturb indicator for WL15-WL21 and MLC 665 may serve as a read disturb indicator for WL22-WL28. Thus, a write to TLC 630 may cause a test voltage (e.g., a Vpass voltage, a read voltage, or the like) to be applied to the SLC 640. One of ordinary skill in the art with the benefit of the present disclosure will understand that the organization of the pages into groups and the assignment of high margin cells to serve as read disturb indicators may vary than that disclosed in FIG. 6. For example, other groupings may be utilized. In some examples, since the SLC has more margin than an MLC page, the SLC page may serve as a read disturb indicator for a larger group of cells than an MLC page.

In the Example of FIG. 6, if the read counter for the superblock 600 exceeds the threshold, the SLC and MLC pages may be scanned. For example, for Plane 0 605 of LUN 0, the SLC pages 640, 660 and MLC pages 625 and 665 may be scanned to determine if the group of TLC pages for which those pages serves as an indicator needs to be scanned. For example, if a voltage level of SLC page 640 is above a threshold, then TLC pages WL2-WL8 may be scanned for read disturb errors. If MLC page 625 has a voltage level above the threshold, then TLC pages WL8-WL14 may be scanned. This process may apply to all the indicator pages and groups of pages in the superblock.

Figure 7:
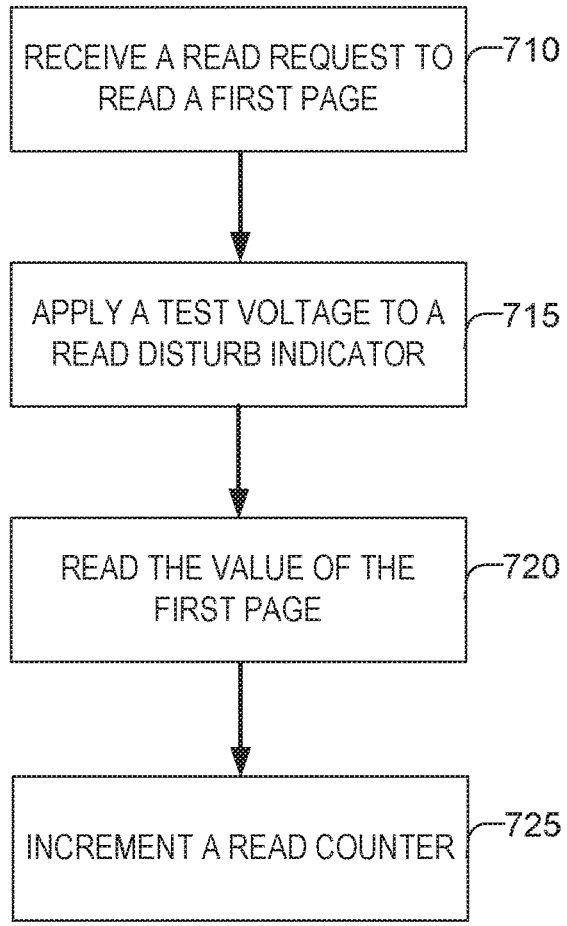
FIG. 7 illustrates a flowchart of a method for reading a page according to some examples of the present disclosure.

Turning now to FIG. 7, a flowchart of a method 700 for reading a page is shown according to some examples of the present disclosure. At operation 710 the controller may receive a request to read a first page in the NAND. For example, a TLC cell. At operation 715 a test voltage may be applied to the read disturb indicator page assigned to the group in which the first page is a member. The read disturb indicator page may be a page that has a higher read disturb margin than the first page. At operation 720 the value of the first page may be read (e.g., from the sense amplifier). If the read request is for the indicator cell, the read voltage may be applied to the read disturb indicator cell to read the value of the user data stored therein. In some examples, the pass-through voltage may then be applied after the read voltage is applied to read the value. At operation 725, the controller may increment a read counter for an organizational unit the first page is part of. For example, a read counter for a superblock that the first page belongs to.

Figure 8:
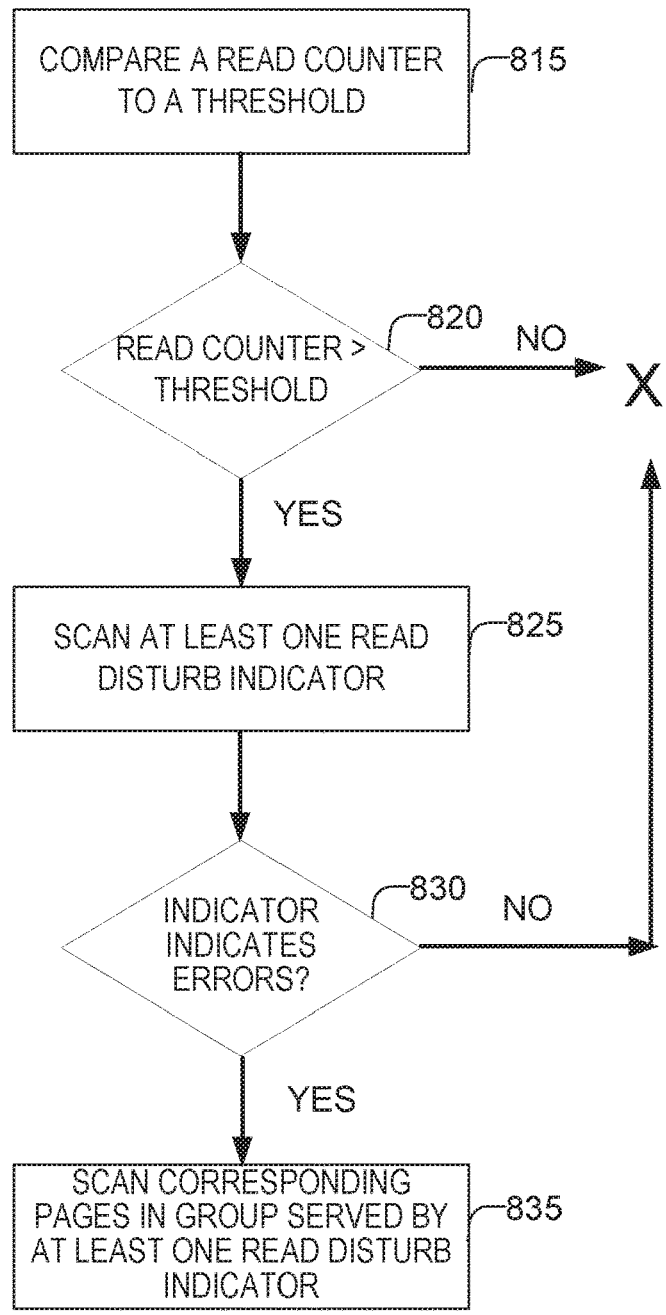
FIG. 8 illustrates a flowchart of a method of a read disturb scan according to some examples of the present disclosure.

Turning now to FIG. 8, a method 800 of a read disturb scan is shown according to some examples of the present disclosure. At operation 815 a read counter may be compared to a threshold. The read counter may count the number of read requests issued for physical pages within a superblock or other organizational unit of the NAND. The organizational unit of the NAND may be any organizational unit (e.g., block, plane, etc.) that has a numerosity of physical pages that exceeds a numerosity of cells in each group of pages serviced by a particular read disturb indicator. The read counter may be compared to the threshold after each read operation (e.g., after operation 725 of FIG. 7), during idle periods of the NAND controller, every predetermined period of time (e.g., once an hour, once a day, once a week), and the like.

If the read counter is below or equal to a threshold at operation 820, the method may end. If the counter is above the threshold, then the NAND memory device may scan at least one read disturb indicator of the groups of pages in the organizational unit of the NAND serviced by the read counter (e.g., the superblock) at operation 825. Scanning the corresponding read disturb indicators may include scanning for bit errors, comparing the voltage in the read disturb indicator pages to a threshold voltage, and the like. The threshold voltage may be selected to be a voltage that correlates to bit errors, or near-bit errors in the TLC cells. For example, voltage A may correspond to a first bit value, and voltage B may correspond to a second bit value of a TLC cell, where voltage B is greater than voltage A. Likewise, voltage C indicates a voltage corresponding to as bit stored in the read disturb indicator. The threshold may be a voltage that is C+(B·A)−x. X may be a margin voltage. In some examples, x may be an expected voltage gain for a single read disturb effect (e.g., if each read disturb is expected to add X volts to the cell, then the margin is X) multiplied by a predetermined number of reads. Thus, the margin x determines a sensitivity of the NAND to scanning the group members. A higher x indicates that the NAND will move cells experiencing less read effects than a lower x. As x gets lower, the greater the chance of having a read disturb error.

A determination is made at operation 830 whether the at least one read disturb indicator indicates that the pages in a group may have read disturb errors or may be likely to have read disturb errors shortly. If the determination at operation 830 is no (e.g., there are no bit errors in the read disturb indicators, or the voltage in the read disturb indicators is below the threshold), then the method ends. If the determination at operation 830 is yes (e.g., there are bit errors, or the voltage is above the threshold), then at operation 835 the pages in the group corresponding to the at least one read indicator may be scanned and remedial action may be taken if any read disturb errors are found or are likely in those cells. The operations of 825 and 835 may be taken for each particular read disturb indicator in the organizational unit serviced by the read counter that exceeds the threshold at operation 815.

Figure 9:
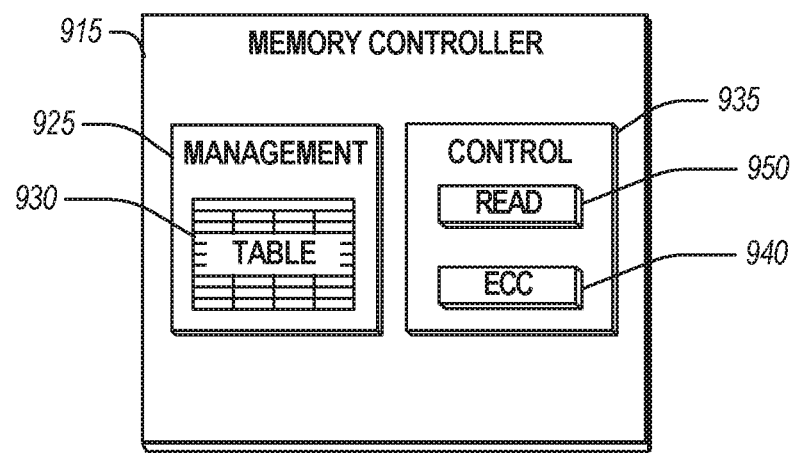
FIG. 9 shows an example block diagram of a memory device according to some examples of the present disclosure.

FIG. 9 shows an example block diagram of a memory device 915 according to some examples of the present disclosure. Memory device 915 may be an example of memory device 115. Memory device 915 may include manager 925, table 930, controller 935, read component 950, ECC component 940. Manager 925 may be an example of manager 125, table 930 may be an example of table 130, controller 935 may be an example of controller 135, and ECC component 940 may be an example of ECC component 140. Read component 950 may handle read requests from a host device, including determining groups of pages and corresponding read disturb indicator pages. Upon receipt of the read request, the read component 950 may apply a read voltage to the requested page to read the value of the page. The read component 950 may also apply the test voltage to the read disturb indicator that corresponds to the group the requested page is in. The read component 950 may increment the read counter upon receiving a read request. The ECC component 940 may check the read count against the threshold, and if the read count is greater than the threshold, the ECC component 940 may (via the read component 950) scan one or more of the read disturb indicator pages to determine if a read disturb is indicated. If the read disturb is indicated, the ECC 940 may scan the pages within the group corresponding to those read disturb indicator pages that indicate a read disturb. ECC 940 may move pages that indicate a present read disturb error or indicate a read disturb error is likely in the future. A read disturb may be indicated based upon a number of bit errors (determined by ECC) exceeding a threshold, a voltage level exceeding a threshold, and the like.

Figure 10:
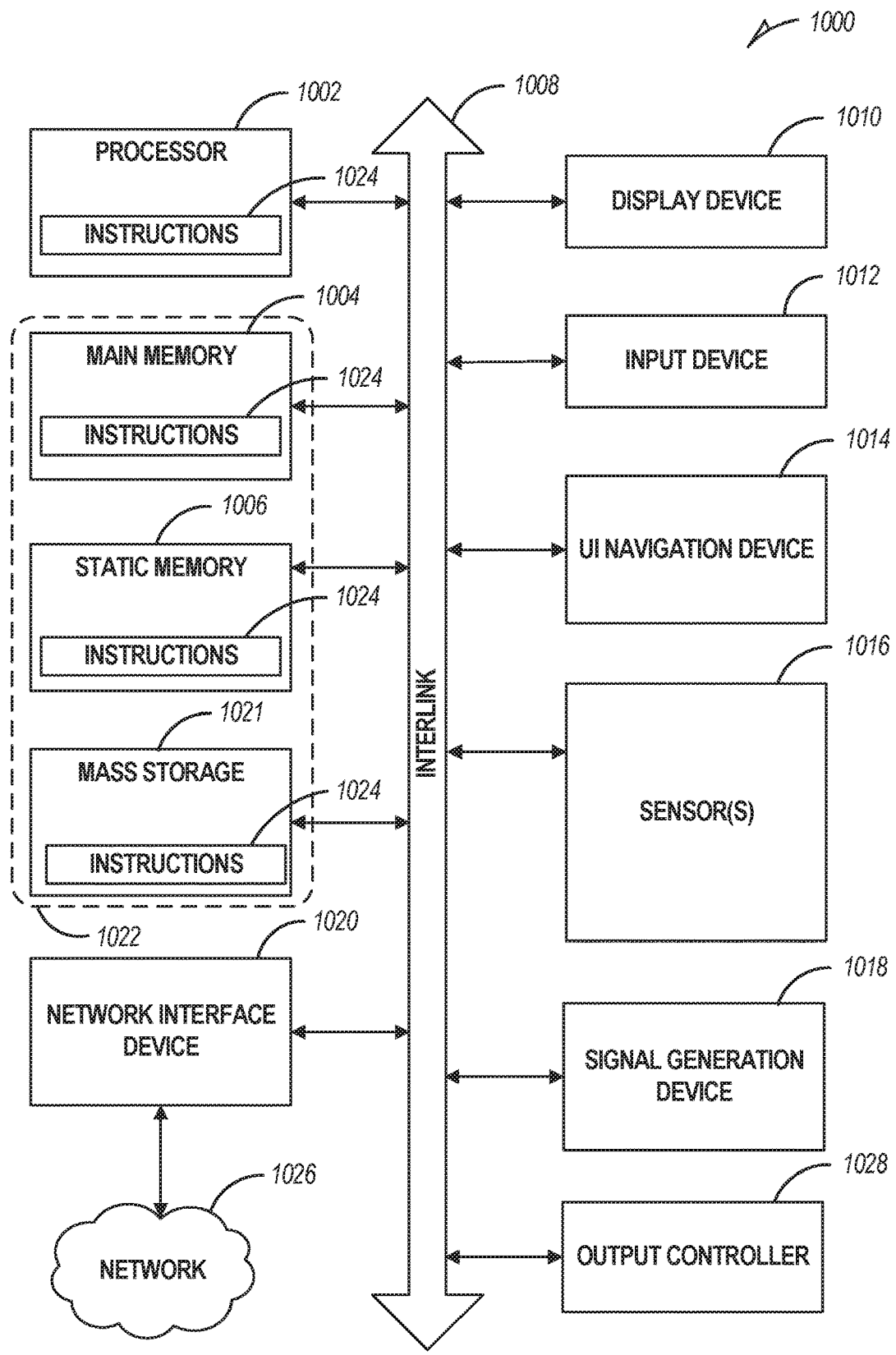
FIG. 10 is a block diagram illustrating an example of a machine upon which one or more embodiments may be implemented.

FIG. 10 illustrates a block diagram of an example machine 1000 upon which any one or more of the techniques (e.g., methodologies) discussed herein may perform. In alternative embodiments, the machine 1000 may operate as a standalone device or may be connected (e.g., networked) to other machines. In a networked deployment, the machine 1000 may operate in the capacity of a server machine, a client machine, or both in server-client network environments. In an example, the machine 1000 may act as a peer machine in peer-to-peer (P2P) (or other distributed) network environment. The machine 1000 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible overtime and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 1000 (e.g., the host device 105, the memory device 110, etc.) may include a hardware processor 1002 (e.g., a central processing unit (CPU), a graphics processing unit (GPU), a hardware processor core, or any combination thereof, such as the memory controller 115, etc.), a main memory 1004 and a static memory 1006, some or all of which may communicate with each other via an interlink (e.g., bus) 1008. The machine 1000 may further include a display unit 1010, an alphanumeric input device 1012 (e.g., a keyboard), and a user interface (UI) navigation device 1014 (e.g., a mouse). In an example, the display unit 1010, input device 1012 and UI navigation device 1014 may be a touch screen display. The machine 1000 may additionally include a storage device (e.g., drive unit) 1016, a signal generation device 1018 (e.g., a speaker), a network interface device 1020, and one or more sensors 1016, such as a global positioning system (GPS) sensor, compass, accelerometer, or other sensor. The machine 1000 may include an output controller 1028, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 1016 may include a machine readable medium 1022 on which is stored one or more sets of data structures or instructions 1024 (e.g., software) embodying or utilized by any one or more of the techniques or functions described herein. The instructions 1024 may also reside, completely or at least partially, within the main memory 1004, within static memory 1006, or within the hardware processor 1002 during execution thereof by the machine 1000. In an example, one or any combination of the hardware processor 1002, the main memory 1004, the static memory 1006, or the storage device 1016 may constitute the machine readable medium 1022.

While the machine readable medium 1022 is illustrated as a single medium, the term "machine readable medium" may include a single medium or multiple media (e.g., a centralized or distributed database, or associated caches and servers) configured to store the one or more instructions 1024.

The term "machine readable medium" may include any medium that is capable of storing, encoding, or carrying instructions for execution by the machine 1000 and that cause the machine 1000 to perform any one or more of the techniques of the present disclosure, or that is capable of storing, encoding or carrying data structures used by or associated with such instructions. Non-limiting machine readable medium examples may include solid-state memories, and optical and magnetic media. In an example, a massed machine readable medium comprises a machine-readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 1024 (e.g., software, programs, an operating system (OS), etc.) or other data are stored on the storage device 1021, can be accessed by the memory 1004 for use by the processor 1002. The memory 1004 (e.g., DRAM) is typically fast, but volatile, and thus a different type of storage than the storage device 1021 (e.g., an SSD), which is suitable for long-term storage, including while in an "off" condition. The instructions 1024 or data in use by a user or the machine 1000 are typically loaded in the memory 1004 for use by the processor 1002. When the memory 1004 is full, virtual space from the storage device 1021 can be allocated to supplement the memory 1004; however, because the storage 1021 device is typically slower than the memory 1004, and write speeds are typically at least twice as slow as read speeds, use of virtual memory can greatly reduce user experience due to storage device latency (in contrast to the memory 1004, e.g., DRAM). Further, use of the storage device 1021 for virtual memory can greatly reduce the usable lifespan of the storage device 1021.

In contrast to virtual memory, virtual memory compression (e.g., the Linux® kernel feature "ZRAM") uses part of the memory as compressed block storage to avoid paging to the storage device 1021. Paging takes place in the compressed block until it is necessary to write such data to the storage device 1021. Virtual memory compression increases the usable size of memory 1004, while reducing wear on the storage device 1021.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device, and are often removable and separate components from the host device. In contrast, eMMC™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 1024 may further be transmitted or received over a communications network 1026 using a transmission medium via the network interface device 1020 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 1020 may include one or more physical jacks (e.g., Ethernet, coaxial, or phone jacks) or one or more antennas to connect to the communications network 1026. In an example, the network interface device 1020 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 1000, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" may include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The term "horizontal" as used in this document is defined as a plane parallel to the conventional plane or surface of a substrate, such as that underlying a wafer or die, regardless of the actual orientation of the substrate at any point in time. The term "vertical" refers to a direction perpendicular to the horizontal as defined above. Prepositions, such as "on," "over," and "under" are defined with respect to the conventional plane or surface being on the top or exposed surface of the substrate, regardless of the orientation of the substrate; and while "on" is intended to suggest a direct contact of one structure relative to another structure which it lies "on" (in the absence of an express indication to the contrary); the terms "over" and "under" are expressly intended to identify a relative placement of structures (or layers, features, etc.), which expressly includes—but is not limited to—direct contact between the identified structures unless specifically identified as such. Similarly, the terms "over" and "under" are not limited to horizontal orientations, as a structure may be "over" a referenced structure if it is, at some point in time, an outermost portion of the construction under discussion, even if such structure extends vertically relative to the referenced structure, rather than in a horizontal orientation.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the various embodiments is defined only by the appended claims, along with the full scope of equivalents to which such claims are entitled.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

As used herein, directional adjectives, such as horizontal, vertical, normal, parallel, perpendicular, etc., can refer to relative orientations, and are not intended to require strict adherence to specific geometric properties, unless otherwise noted. For example, as used herein, a vertical structure need not be strictly perpendicular to a surface of a substrate, but may instead be generally perpendicular to the surface of the substrate, and may form an acute angle with the surface of the substrate (e.g., between 60 and 120 degrees, etc.).

In some embodiments described herein, different doping configurations may be applied to a source-side select gate (SGS), a control gate (CG), and a drain-side select gate (SGD), each of which, in this example, may be formed of or at least include polysilicon, with the result such that these tiers (e.g., polysilicon, etc.) may have different etch rates when exposed to an etching solution. For example, in a process of forming a monolithic pillar in a 3D semiconductor device, the SGS and the CG may form recesses, while the SGD may remain less recessed or even not recessed. These doping configurations may thus enable selective etching into the distinct tiers (e.g., SGS, CG, and SGD) in the 3D semiconductor device by using an etching solution (e.g., tetramethylammonium hydroxide (TMCH)).

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMs), read only memories (ROMs), solid state drives (SSDs), Universal Flash Storage (UFS) device, embedded MMC (eMMC) device, and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

Other Notes and Examples

Example 1 is a NAND memory device comprising: a pool of NAND cells; and a controller executing instructions that cause the controller to perform operations comprising: receiving a command to read a indicated page of the pool of NAND cells; and responsive to receiving the command, applying a test voltage to a second page of the pool of NAND cells, wherein the second page is a read disturb indicator page corresponding to a group of pages of the pool of NAND cells including the first page, and the read disturb indicator page is composed of NAND cells of a type that has a greater read disturb margin than the first page.

In Example 2, the subject matter of Example 1 optionally includes wherein the operations further comprise, applying a read voltage to the indicated page to read a value stored in the first page, and incrementing a read counter.

In Example 3, the subject matter of Example 2 optionally includes wherein the operations further comprise: determining that the read counter is greater than a threshold; responsive to determining that the read counter is greater than the threshold, scanning the second page to determine that a read disturb is indicated for the group of pages; and responsive to determining that the read disturb is indicated for the group of pages, scanning each page in the group of pages, including the first page, to determine if a read disturb is indicated.

In Example 4, the subject matter of Example 3 optionally includes wherein the operations of scanning the second page to determine if the read disturb is indicated for the group of pages comprises reading the value of the second page and determining that a number of bits that are in error exceeds a threshold.

In Example 5, the subject matter of any one or more of Examples 2-4 optionally include wherein the operations further comprise: determining that the read counter is greater than a threshold; responsive to determining that the read counter is greater than the threshold, scanning the second page to determine if a read disturb is indicated for the group of pages; and responsive to determining that the read disturb is not indicated for the group of pages, refrain from scanning any page in the group of pages.

In Example 6, the subject matter of any one or more of Examples 1-5 optionally include wherein the read disturb indicator page is a Single Level Cell (SLC) or Multi-Level Cell (MLC) and the indicated page is a Triple Level Cell (TLC).

In Example 7, the subject matter of any one or more of Examples 1-6 optionally include wherein the read disturb indicator page is in a same block as the first page.

In Example 8, the subject matter of any one or more of Examples 1-7 optionally include wherein the test voltage is a passthrough voltage.

In Example 9, the subject matter of any one or more of Examples 1-8 optionally include wherein the test voltage is not applied to the second page as a result of a read operation on the first page.

Example 10 is a method performed by a NAND memory device, the method comprising: receiving a command to read a indicated page of a pool of NAND cells in the NAND memory device; and responsive to receiving the command, applying a test voltage to a second page of the pool of NAND cells, wherein the second page is a read disturb indicator page corresponding to a group of pages of the pool of NAND cells including the first page, and the read disturb indicator page is composed of NAND cells of a type that has a greater read disturb margin than the first page.

In Example 11, the subject matter of Example 10 optionally includes wherein the method further comprises applying a read voltage to the indicated page to read a value stored in the first page, and incrementing a read counter.

In Example 12, the subject matter of Example 11 optionally includes wherein the method further comprises: determining that the read counter is greater than a threshold; responsive to determining that the read counter is greater than the threshold, scanning the second page to determine that a read disturb is indicated for the group of pages; and responsive to determining that the read disturb is indicated for the group of pages, scanning each page in the group of pages, including the first page, to determine if a read disturb is indicated.

In Example 13, the subject matter of Example 12 optionally includes wherein scanning the second page to determine if the read disturb is indicated for the group of pages comprises reading the value of the second page and determining that a number of bits that are in error exceeds a threshold.

In Example 14, the subject matter of any one or more of Examples 11-13 optionally include wherein the method further comprises: determining that the read counter is greater than a threshold; responsive to determining that the read counter is greater than the threshold, scanning the second page to determine if a read disturb is indicated for the group of pages; and responsive to determining that the read disturb is not indicated for the group of pages, refrain from scanning any page in the group of pages.

In Example 15, the subject matter of any one or more of Examples 10-14 optionally include wherein the read disturb indicator page is a Single Level Cell (SLC) or Multi-Level Cell (MLC) and the indicated page is a Triple Level Cell (TLC).

In Example 16, the subject matter of any one or more of Examples 10-15 optionally include wherein the read disturb indicator page is in a same block as the first page.

In Example 17, the subject matter of any one or more of Examples 10-16 optionally include wherein the test voltage is a passthrough voltage.

In Example 18, the subject matter of any one or more of Examples 10-17 optionally include wherein the test voltage is not applied to the second page as a result of a read operation on the first page.

Example 19 is a machine-readable medium, comprising instructions, which when performed by a machine, cause the machine to perform operations comprising: receiving a command to read a indicated page of a pool of NAND cells; and responsive to receiving the command, applying a test voltage to a second page of the pool of NAND cells, wherein the second page is a read disturb indicator page corresponding to a group of pages of the pool of NAND cells including the first page, and the read disturb indicator page is composed of NAND cells of a type that has a greater read disturb margin than the first page.

In Example 20, the subject matter of Example 19 optionally includes wherein the operations further comprise, applying a read voltage to the indicated page to read a value stored in the first page, and incrementing a read counter.

In Example 21, the subject matter of Example 20 optionally includes wherein the operations further comprise: determining that the read counter is greater than a threshold; responsive to determining that the read counter is greater than the threshold, scanning the second page to determine that a read disturb is indicated for the group of pages; and responsive to determining that the read disturb is indicated for the group of pages, scanning each page in the group of pages, including the first page, to determine if a read disturb is indicated.

In Example 22, the subject matter of Example 21 optionally includes wherein the operations of scanning the second page to determine if the read disturb is indicated for the group of pages comprises reading the value of the second page and determining that a number of bits that are in error exceeds a threshold.

In Example 23, the subject matter of any one or more of Examples 20-22 optionally include wherein the operations further comprise: determining that the read counter is greater than a threshold; responsive to determining that the read counter is greater than the threshold, scanning the second page to determine if a read disturb is indicated for the group of pages; and responsive to determining that the read disturb is not indicated for the group of pages, refrain from scanning any page in the group of pages.

In Example 24, the subject matter of any one or more of Examples 19-23 optionally include wherein the read disturb indicator page is a Single Level Cell (SLC) or Multi-Level Cell (MLC) and the indicated page is a Triple Level Cell (TLC).

In Example 25, the subject matter of any one or more of Examples 19-24 optionally include wherein the read disturb indicator page is in a same block as the first page.

In Example 26, the subject matter of any one or more of Examples 19-25 optionally include wherein the test voltage is a passthrough voltage.

In Example 27, the subject matter of any one or more of Examples 19-26 optionally include wherein the test voltage is not applied to the second page as a result of a read operation on the first page.

Example 28 is a NAND memory device comprising: means for receiving a command to read a indicated page of a pool of NAND cells; and responsive to receiving the command, means for applying a test voltage to a second page of the pool of NAND cells, wherein the second page is a read disturb indicator page corresponding to a group of pages of the pool of NAND cells including the first page, and the read disturb indicator page is composed of NAND cells of a type that has a greater read disturb margin than the first page.

In Example 29, the subject matter of Example 28 optionally includes wherein the device further comprises means for applying a read voltage to the indicated page to read a value stored in the first page, and means for incrementing a read counter.

In Example 30, the subject matter of Example 29 optionally includes wherein the device further comprises: means for determining that the read counter is greater than a threshold; responsive to determining that the read counter is greater than the threshold, means for scanning the second page to determine that a read disturb is indicated for the group of pages; and responsive to determining that the read disturb is indicated for the group of pages, means for scanning each page in the group of pages, including the first page, to determine if a read disturb is indicated.

In Example 31, the subject matter of Example 30 optionally includes wherein scanning the second page to determine if the read disturb is indicated for the group of pages comprises means for reading the value of the second page and determining that a number of bits that are in error exceeds a threshold.

In Example 32, the subject matter of any one or more of Examples 29-31 optionally include wherein the device further comprises: means for determining that the read counter is greater than a threshold; responsive to determining that the read counter is greater than the threshold, means for scanning the second page to determine if a read disturb is indicated for the group of pages; and responsive to determining that the read disturb is not indicated for the group of pages, means for refraining from scanning any page in the group of pages.

In Example 33, the subject matter of any one or more of Examples 28-32 optionally include wherein the read disturb indicator page is a Single Level Cell (SLC) or Multi-Level Cell (MLC) and the indicated page is a Triple Level Cell (TLC).

In Example 34, the subject matter of any one or more of Examples 28-33 optionally include wherein the read disturb indicator page is in a same block as the first page.

In Example 35, the subject matter of any one or more of Examples 28-34 optionally include wherein the test voltage is a passthrough voltage.

In Example 36, the subject matter of any one or more of Examples 28-35 optionally include wherein the test voltage is not applied to the second page as a result of a read operation on the first page.

The invention claimed is:

1. A NAND memory device comprising:
   a first group of pages made up of NAND memory cells that are configured in a first configuration to store a first number of bits in each cell;
   an indicator page of NAND memory cells that stores host data and serves as a read disturb indicator page for the first group of pages, each of the NAND memory cells of the indicator page configured in a second configuration to store a second number of bits in each cell, the first number of bits greater than the second number of bits;
   a memory controller configured to perform operations comprising:
   storing a first host data value in a first of the NAND memory cells of the first group of pages, the first host data value a size of the first number of bits;
   storing a second host data value in a NAND memory cell of the indicator page, the second host data value a size of the second number of bits;
   determining whether a read counter for the first group of pages of NAND memory cells is above a threshold;
   responsive to determining that the read counter is above the threshold, determining whether the indicator page of NAND memory cells indicates a read disturb error; and
   responsive to determining that the indicator page of NAND memory cells indicates the read disturb error, scanning pages in the first group of pages to determine whether any of those pages have read-disturb errors.

2. The NAND memory device of claim 1, wherein the operations further comprise:
   receiving a read request for a first page in the first group of pages; and
   responsive to receiving the read request:
   incrementing the read counter for the first group of pages;
   applying a test voltage to the indicator page; and
   applying a read voltage to the first page.

3. The NAND memory device of claim 2, wherein the test voltage is a passthrough voltage.

4. The NAND memory device of claim 1, wherein the operations of scanning pages in the first group of pages to determine whether any of those pages have read-disturb errors comprises reading values stored in each page of the first group of pages and determining for each page, whether a number of bits that are in error for that page exceeds a threshold.

5. The NAND memory device of claim 1, wherein the indicator page is configured as Single Level Cells (SLC) or Multi-Level Cells (MLC) and the first group of pages is configured as Triple Level Cells (TLC).

6. The NAND memory device of claim 1, wherein the operations further comprise responsive to determining that the indicator page of NAND memory cells does not indicate the read disturb error, refraining from scanning pages in the first group of pages.

7. The NAND memory device of claim 1, wherein the operations of determining whether the indicator page of NAND memory cells indicates the read disturb error comprises reading a value in the indicator page and determining whether a number of error bits exceeds an error threshold.

8. The NAND memory device of claim 1, wherein the indicator page is in a same block as the first group of pages.

9. The NAND memory device of claim 1, wherein the operations further comprise:

determining whether a second read counter for a second group of pages of NAND memory cells is above a second threshold, the second group of pages comprising NAND memory cells that are each configured to store the first number of bits;

responsive to determining that the second read counter is above the second threshold, determining whether a second indicator page of NAND memory cells that serves as a read disturb indicator page for the second group of pages indicates a read disturb error, the second indicator page comprising NAND memory cells that are each configured to store a third number of bits, the first number of bits greater than both the second number of bits and the third number of bits, the third number of bits greater than the second number of bits, the second indicator page storing host data during its use as an indicator page; and responsive to determining that the second indicator page of NAND memory cells indicates the read disturb error, scanning pages in the second group of pages to determine whether any of those pages have read-disturb errors; and wherein a number of pages in the first group of pages is greater than a number of pages in the second group of pages.

10. The NAND memory device of claim 1, wherein the read counter is for a superblock and wherein the first group of pages is less than a superblock.

11. A method performed by a NAND memory controller, the method comprising:

determining whether a read counter for a first group of pages of NAND memory cells is above a threshold, the first group of pages from a pool of pages of NAND cells, the first group of pages comprising NAND memory cells configured to store a first number of bits;

responsive to determining that the read counter is above the threshold, determining whether an indicator page of NAND memory cells that serves as a read disturb indicator page for the first group of pages indicates a read disturb error, the indicator page comprising NAND memory cells configured to store a second number of bits, the first number of bits greater than the second number of bits, the indicator page storing host data during its use as an indicator page; and responsive to determining that the indicator page of NAND memory cells indicates the read disturb error, scanning pages in the first group of pages to determine whether any of those pages have read-disturb errors.

12. The method of claim 11, wherein the method further comprises:

receiving a read request for a first page in the first group of pages; and responsive to receiving the read request:

incrementing the read counter for the first group of pages;

applying a test voltage to the indicator page; and applying a read voltage to the first page.

13. The method of claim 12, wherein the test voltage is a passthrough voltage.

14. The method of claim 11, wherein scanning pages in the first group of pages to determine whether any of those pages have read-disturb errors comprises reading values stored in each page of the first group of pages and determining for each page, whether a number of bits that are in error for that page exceeds a threshold.

15. The method of claim 11, wherein the indicator page is configured as Single Level Cells (SLC) or Multi-Level Cells (MLC) and the first group of pages is configured as Triple Level Cells (TLC).

16. The method of claim 11, wherein the method further comprises:

determining whether a second read counter for a second group of pages of NAND memory cells is above the threshold, the second group of pages from the pool of pages of NAND cells, the second group of pages comprising NAND memory cells configured to store the first number of bits;

responsive to determining that the second read counter is above the threshold, determining whether a second indicator page of NAND memory cells that serves as a read disturb indicator page for the second group of pages indicates a read disturb error, the second indicator page comprising NAND memory cells configured to store the second number of bits, the second indicator page storing host data during its use as an indicator page; and responsive to determining that the second indicator page of NAND memory cells does not indicate the read disturb error, refraining from scanning pages in the second group of pages to determine whether any of those pages have read-disturb errors.

17. The method of claim 11, wherein determining whether an indicator page of NAND memory cells that serves as a read disturb indicator page for the first group of pages indicates a read disturb error comprises reading a value in the indicator page and determining whether a number of error bits exceeds an error threshold.

18. The method of claim 11, wherein the indicator page is in a same block as the first group of pages.

19. The method of claim 11, wherein the method further comprises:

determining whether a second read counter for a second group of pages of NAND memory cells is above a second threshold, the second group of pages from the pool of pages of NAND cells, the second group of pages comprising NAND memory cells configured to store a first number of bits;

responsive to determining that the second read counter is above the second threshold, determining whether a second indicator page of NAND memory cells that serves as a read disturb indicator page for the second group of pages indicates a read disturb error, the second indicator page comprising NAND memory cells configured to store a third number of bits, the first number of bits greater than both the second number of bits and the third number of bits, the third number of bits greater than the second number of bits, the second indicator page storing host data during its use as an indicator page; and responsive to determining that the second indicator page of NAND memory cells indicates the read disturb error, scanning pages in the second group of pages to determine whether any of those pages have read-disturb errors; and wherein a number of pages in the first group of pages is greater than a number of pages in the second group of pages.

20. The method of claim 11, wherein the read counter is for a superblock and wherein the first group of pages is less than a superblock.

* * * * *